United States Patent
Hijzen et al.

(10) Patent No.: US 6,956,264 B2
(45) Date of Patent: Oct. 18, 2005

(54) TRENCHED SEMICONDUCTOR DEVICES AND THEIR MANUFACTURE

(75) Inventors: Erwin A. Hijzen, Blanden (BE); Michael A. A. In't Zandt, Veldhoven (NL); Raymond J. E. Hueting, Helmond (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/308,656

(22) Filed: Dec. 3, 2002

(65) Prior Publication Data

US 2003/0146470 A1 Aug. 7, 2003

(30) Foreign Application Priority Data

Dec. 8, 2001 (GB) ............................................. 0129450

(51) Int. Cl.[7] ......................... H01L 29/76; H01L 29/94
(52) U.S. Cl. ..................... 257/330; 257/328; 257/329; 438/259; 438/270; 438/271
(58) Field of Search ................. 438/294, 296; 257/330, 331, 332, 341, 342

(56) References Cited

U.S. PATENT DOCUMENTS

| | | | | |
|---|---|---|---|---|
| 5,250,450 A | * | 10/1993 | Lee et al. ................... | 438/270 |
| 5,612,567 A | | 3/1997 | Baliga ......................... | 257/475 |
| 5,637,898 A | | 6/1997 | Baliga ......................... | 257/330 |
| 6,413,827 B2 | * | 7/2002 | Farrar ......................... | 438/296 |
| 6,498,382 B2 | * | 12/2002 | Hirler et al. ................. | 257/510 |
| 6,576,953 B2 | * | 6/2003 | Hirler ......................... | 257/329 |

FOREIGN PATENT DOCUMENTS

WO  WO0108226  2/2001  ........... H01L/29/78

OTHER PUBLICATIONS

"Power Semiconductor Devices" by B. Jayant Baliga, PWS Publishing Company; pp. 387 to 395.

* cited by examiner

*Primary Examiner*—Donghee Kang

(57) ABSTRACT

In semiconductor devices which include an insulated trench electrode (11) in a trench (20), for example, trench-gate field effect power transistors and trenched Schottky diodes, a cavity (23) is provided between the bottom (25) of the trench electrode (11) and the bottom (27) of the trench (20) to reduce the dielectric coupling between the trench electrode (11) and the body portion at the bottom (27) of the trench in a compact manner. In power transistors, the reduction in dielectric coupling reduces switching power losses, and in Schottky diodes, it enables the trench width to be reduced.

7 Claims, 7 Drawing Sheets

TRENCHED SEMICONDUCTOR DEVICES AND THEIR MANUFACTURE

The present invention relates to semiconductor devices which include an insulated trench electrode in a trench, and the manufacture thereof. For example, it concerns trench-gate field effect power transistors and trenched Schottky diodes.

Ideally, a power transistor would be able to switch between its "off-state" and "on-state" (and vice versa) with no power dissipation. However, substantial switching power losses occur in real power devices and there has always therefore been a desire to design the devices so as to minimise these losses, particularly for applications requiring high frequency switching.

The transient waveforms associated with a power MOSFET when the device is switched on and off are discussed for example in "Power Semiconductor Devices" by B. Jayant Baliga, pages 387 to 395 (hereinafter referred to as "Baliga"), the contents of which are hereby incorporated herein as reference material. Typical waveforms for such a device at turn-on when connected to an inductive load are schematically illustrated in FIGS. 1A to 1C herein. FIG. 1A shows the gate-source voltage, Vgs, FIG. 1B the drain-source current, Ids, and FIG. 1C the drain-source voltage, Vds.

Three consecutive time intervals are shown in FIGS. 1A to 1C, namely t1, t2 and t3. It can be seen that a significant proportion of the power dissipation occurs during the intervals t2 and t3. In t2, Vds is at its maximum blocking value and Ids rises, whilst in t3, Ids is relatively high and Vds falls from its maximum value. Similar waveforms are generated in reverse during turn-off. It is noted in Baliga that lowering the gate-drain capacitance of the power MOSFET device would reduce the length of interval t3 and therefore the amount of power loss at turn-on and similarly at turn-off. The invention seeks to achieve this result.

The present invention is also directed at trench-gate field effect transistors in which a field plate is provided in the trench below the gate electrode and is connected thereto. A device of this form is disclosed for example in International Specification No. WO-A-01/08226 (our reference PHN17572) and U.S. Pat. No. 5,637,898. The whole contents of both documents are hereby incorporated herein as reference material. In configurations shown in these documents, a thicker layer of dielectric material is provided between the field plate and the semiconductor body of the device than between the gate electrode and the semiconductor body. This serves to avoid electric field concentration at the bottom corners of the trench which may lead to oxide breakdown, thereby improving the voltage blocking capability of the transistor.

The invention also concerns Schottky rectifiers with trenched electrodes, as disclosed in U.S. Pat. No. 5,612,567, for example. The whole contents thereof are hereby incorporated herein as reference material. As described therein, a thick dielectric layer is preferably provided along the sides of and below the trenched anode electrode to inhibit field crowding around the electrode and to increase the breakdown voltage of the device.

It is an aim of the present invention to provide an improved semiconductor device in which the desired dielectric coupling between a trench electrode and the body of the device is achieved in a compact manner.

The present invention provides a semiconductor device including an insulated trench electrode in a trench, the trench extending in a semiconductor body portion of the device, wherein the trench electrode is dielectrically coupled to the body portion by an insulating layer at a side-wall of the trench, and there is a cavity between the bottom of the trench electrode and the bottom of the trench to reduce the dielectric coupling between the trench electrode and the body portion at the bottom of the trench.

Thus, at least part of the dielectric coupling between the trench electrode and the semiconductor body is provided by the contents of the cavity. The cavity may extend along the sides of a lower portion of the trench electrode, and may furthermore provide at least part of said insulating layer.

Typically the space that is defined in the body portion by the cavity will have some gaseous content. The cavity may be filled with a predetermined gas at a predetermined pressure such that the dielectric constant for its contents is substantially lower than that of a typical insulating material such as silicon dioxide. Generally, the dielectric coupling across the cavity will be very much less dependent on the precise gaseous content of the cavity than on the cavity thickness. The dielectric constant of most of the commonly available gases is very close to one (unity), so that the gaseous cavity will have a permittivity very close to that of free space. At atmospheric pressure, the dielectric constant for common gases such as oxygen, nitrogen, carbon dioxide and air is less than 1.001. By comparison, the dielectric constant for silicon dioxide is in the range of about 3.9 to 4.9 (depending on its manner of formation), while that of silicon nitride is in the range of about 6 to 9.

The gas pressure in the cavity may be substantially below atmospheric pressure and the contents may be close to a vacuum. Owing to the relatively low dielectric constant exhibited by the contents of the cavity, it enables a reduced level of coupling between the trench electrode and an adjacent portion of the semiconductor body to be achieved in a relatively compact manner. Thus devices may be made more compact by employing a cavity rather than a wider region of solid material to provide substantially equivalent dielectric properties.

At least one of the bottom of the trench, the side-walls of the trench, and the trench electrode may define at least part of the cavity. Preferably, a passivation layer is provided over the trench wall (and additionally may also extend over the trench electrode) which forms part of the wall of the cavity. This layer may be formed of silicon dioxide, for example.

The present invention further provides a method of forming a semiconductor device including an insulated trench electrode in a trench, the trench extending through a semiconductor body portion of the device, and the trench electrode being dielectrically coupled to the body portion by an insulating layer at a side-wall of the trench, the method including the steps of:

(a) etching a trench into the body portion;

(b) providing a layer of filler material over the bottom of the trench;

(c) providing trench electrode material in the trench with a path defined through the trench electrode material to the underlying filler material;

(d) etching to remove filler material between the trench electrode material and the bottom of the trench; and (e) closing the path through the trench electrode material to leave a cavity between the trench electrode material and the bottom of the trench. The cavity reduces the dielectric coupling between the trench electrode and the body portion at the bottom of the trench, compared with an equivalent structure having a traditional dielectric of the same thickness.

The path through the trench electrode material may conveniently be formed in step (c) by forming spacers of trench electrode material over opposing side-walls of the trench. The path is preferably closed in step (e) by oxidising the trench electrode material to grow oxide thereover, which eventually spans the path. In a preferred embodiment, the trench is then filled with additional trench electrode material.

The filler material may be the same material as that of the trench electrode insulating layer. Alternatively, the filler material is different to that of the trench electrode insulating layer and is selectively etchable with respect thereto.

Various further preferred features in accordance with the invention are described below and set out in dependent Claims.

Embodiments of the invention will now be described by way of example and with reference to the accompanying schematic drawings, wherein:

FIGS. 1A to 1C show typical waveforms for a power MOSFET at turn-on;

Figure 1A:
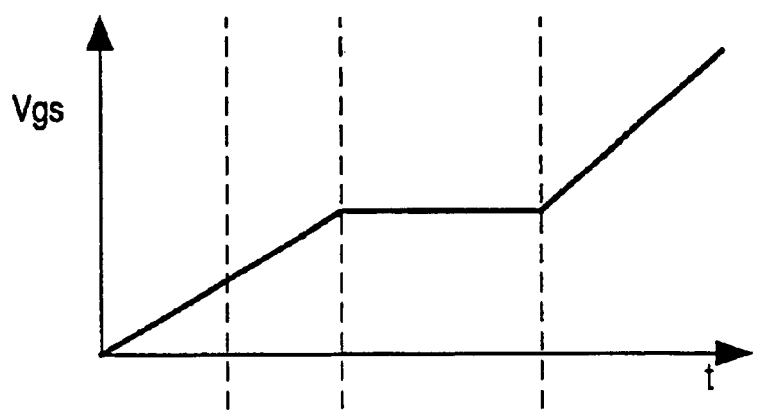
Figure 1B:
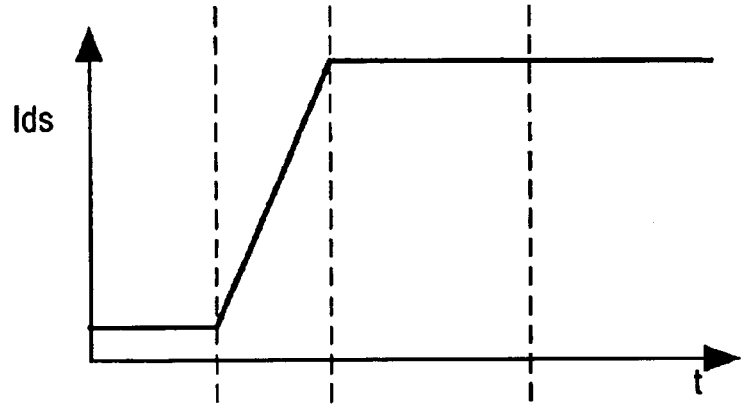

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

Figure 7:
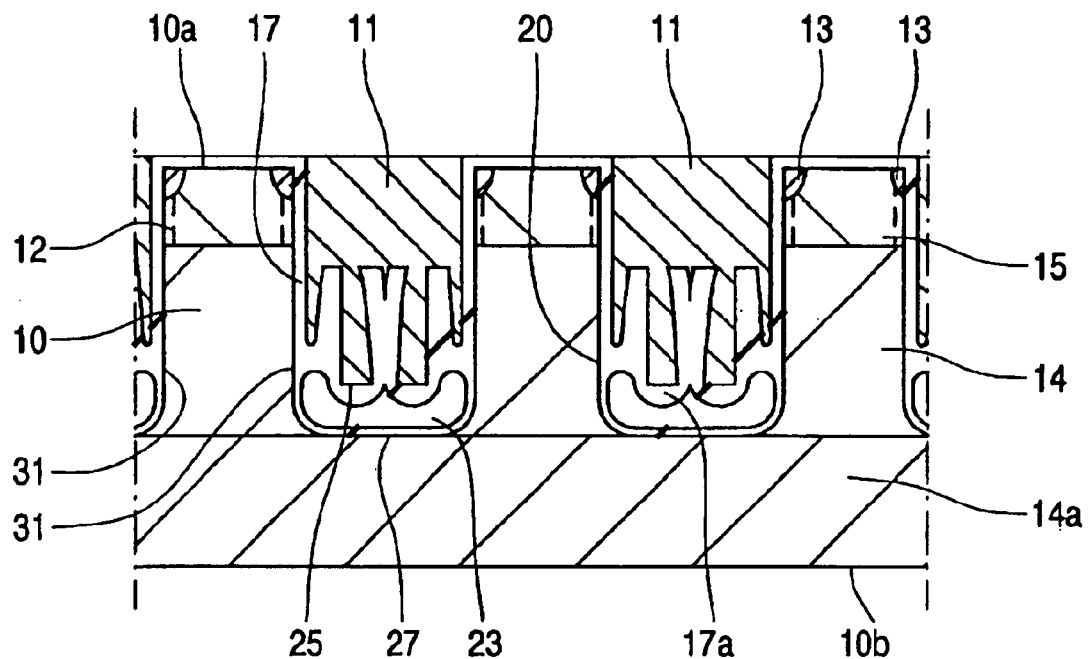

FIG. 7 illustrates a cross-sectional view of a transistor cell area of an exemplary embodiment of a power semiconductor device of the invention at a stage in manufacture near to its completion. The device has a trench electrode in the form of a trench gate 11. Source and drain regions 13 and 14,14a, respectively, of a first conductivity type (n-type in this example) are separated by a channel-accommodating body region 15 of the opposite second conductivity type (i.e. p-type in this example). The drain region comprises a low doped drift region 14 adjacent a drain contact region 14a. The drift region consists, for example, of an epitaxial layer of high resistivity, which is deposited on a substrate contact region 14a of high conductivity.

The gate 11 is present in a trench 20 which extends into the semiconductor body 10 of the device (typically of monocrystalline silicon), through the regions 13 and 15 into an underlying portion of the drift region 14, at least partway towards the drain contact region 14a. A thin layer 17 of silicon dioxide insulates the gate 11 from the adjacent portion of the semiconductor body 10. The application of a voltage signal to the gate 11 in the on-state of the device serves in known manner for inducing a conduction channel 12 in the region 15 and for controlling current flow in this conduction channel 12 between the source and drain regions 13 and 14,14a.

In the finished device, an oxide cap is provided over the gate 11. The source region 13 is contacted by a source electrode at the top major surface 10a of the semiconductor body 10, which electrode overlies the oxide cap. The drain contact region 14a is contacted at the bottom major surface 10b of the device body by a drain electrode. These further elements are not shown in FIG. 7, and may be formed in known ways.

As shown in FIG. 7, a cavity is incorporated in the body portion 14 to provide a space or void between the bottom 25 of the gate 11 and the bottom of the trench 20. The cavity 23 is defined by, that is its walls are formed by, the thin passivating layer of silicon dioxide 17 which extends over the bottom 27 and side walls 31 of the trench 20, and the thin passivating layer of silicon dioxide 17a over the bottom 25 of the gate 11.

In the illustrated embodiment, the trench 20 extends across the drain drift region 14 to the drain contact region 14a, and the cavity 23 extends substantially from the gate 11 to the drain contact region. Preferably, the cavity extends at least halfway, or more preferably two thirds of the way or more, across from the bottom of the trench electrode to the drain contact region.

Figure 1C:
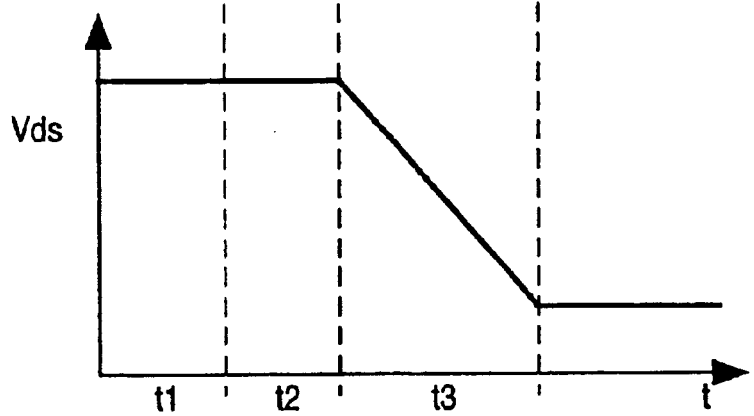

The cavity defines a region with a relatively low dielectric constant (that is, close to unity), and therefore reduces the gate-drain capacitance of a trench-gate device. This leads to a faster decrease in the value of Vds during the initial part of period t3 shown in FIG. 1C, and so reduces the power loss during turn-on of the device. It will be appreciated that similar considerations apply to the converse situation of turn-off of the device. As the cavity reduces the gate-drain capacitance of the device, Vds increases more rapidly, leading to lower power losses at turn-off.

As the cavity is laterally confined to be within the width of the trench 20, it does not significantly affect the steady-state on and off characteristics of the device, because the main portion of the drain drift region over the main area of the device between the gate trenches is not altered.

As an alternative to this vertical discrete device structure, an integrated device is also possible in accordance with the invention. In this case, the region 14a may be a doped buried layer between a device substrate and the epitaxial low-doped drain region 14. This buried layer region 14a may be contacted by an electrode at the front major surface 10a, via a doped peripheral contact region which extends from the surface 10a to the depth of the buried layer.

No plan view of the cellular layout geometry is shown in the drawings, because the configurations and methods described herein may be used for quite different, known cell geometries. Thus, for example the cells may have a square geometry, or they may have a close-packed hexagonal geometry or an elongate stripe geometry. In each case, the trench 20 (with its gate 11) extends around the boundary of each cell. FIG. 7 shows only a few cells, but typically the device comprises many thousands of these parallel cells. The active cellular area of the device may be bounded around the periphery of the body 10 by various known peripheral termination schemes (also not shown). Such schemes normally include the formation of a thick field-oxide layer at the peripheral area of the body surface 10a, before the transistor cell fabrication steps. Furthermore, various known circuits (such as gate-control circuits) may be integrated with the device in an area of the body 10, between the active cellular area and the peripheral termination scheme. Typically their circuit elements may be fabricated with their own layout in this circuit area using some of the same masking and doping steps as are used for the transistor cells.

Process steps leading to the configuration shown in FIG. 7 will now be described with reference to FIGS. 2 to 6.

Figure 2:
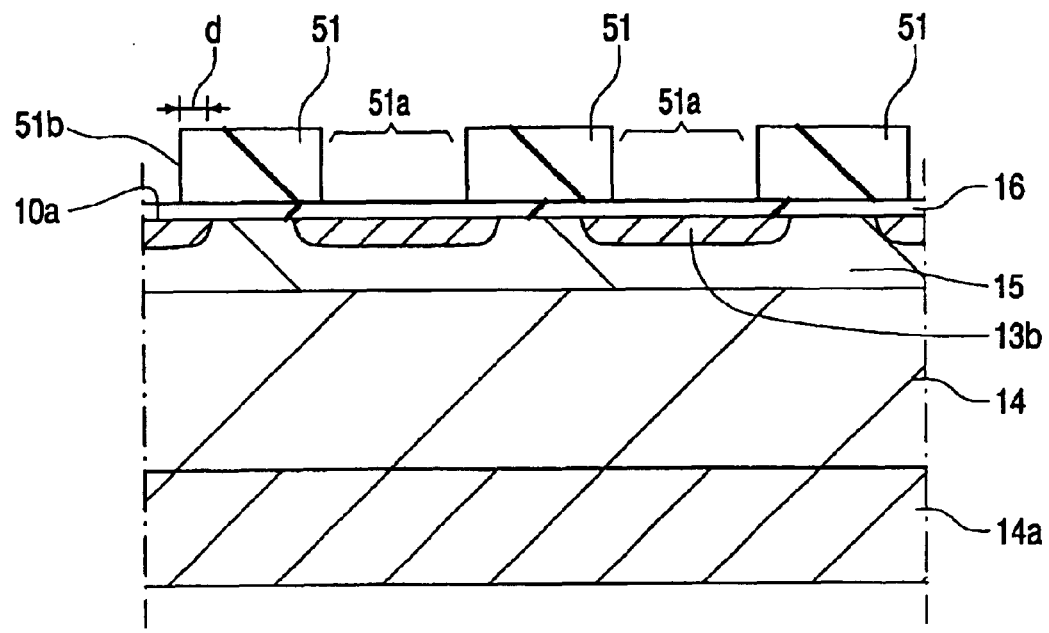
FIGS. 2 to 7 are cross-sectional views of transistor cell areas of a semiconductor body at successive stages in the manufacture of a trench-gate power transistor by one example of a method in accordance with the present invention.

The elements of the transistor cells shown in FIG. 2 may be formed using known processes, which are not therefore described in detail here. In this example, a thin layer 16 of silicon dioxide or other suitable insulator overlies the top major surface 10a of the semiconductor body 10. A mask 51 is provided over layer 16 and may be formed from photoresist or silicon nitride for example in a standard manner using photolithography and etching. The thin oxide layer 16 may be provided to reduce mechanical stress between the semiconductor body 10 and the mask. The mask defines windows 51a. Regions 13b comprise implanted and diffused donor ions, which eventually define the source regions. The regions 13b extend laterally below the mask 51 at a distance d beyond the masking edge 51b of each window 51a. These diffused regions 13b form an hexagonal grid pattern in the case of hexagonal geometry cells. In a typical example, the lateral distance d is 0.1 to 0.5 microns. Low doped drain drift region 14 may typically be grown as an epitaxial layer of the first conductivity type.

Figure 3:
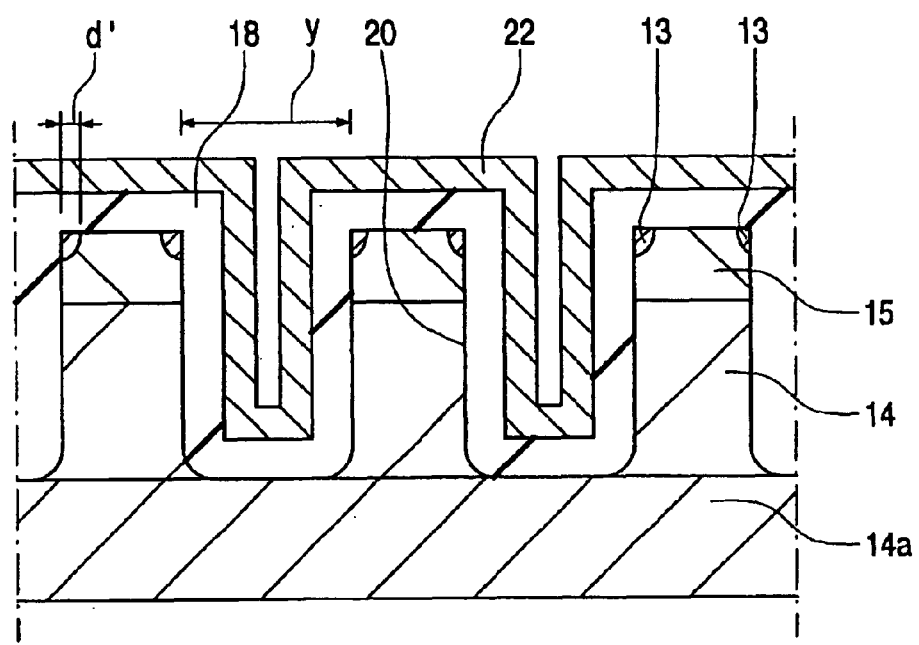

An etching treatment is now carried out at the windows 51a of the mask 51. When a thin oxide layer (such as 16) is present, this oxide layer is first etched away at the windows 51a. A silicon-etching treatment is then carried out in known manner, using the silicon nitride mask 51 as an etchant mask, to etch the trench 20 into the silicon body 10 at the windows 51a, as shown in FIG. 3. The layout pattern of the trench 20 is an hexagonal grid when an hexagonal geometry device is being manufactured. The remaining portions of the diffused regions 13b that adjoin the trench 20 form the source regions 13 of the transistor cells. The lateral extent d' of the source region 13 is determined by the extent to which the trench etching extends under the mask 51 beyond the edge 51b. This can be well-controlled using anisotropic plasma etching for at least most of the depth of the trench 20. However, it can be advantageous to use a final brief isotropic etch in order to round the bottom corners of the trench 20. The width y of the etched trench 20 may be, for example, in the range of 0.1 to 2.0 microns. The mask 51 is then etched away.

In device manufacturing processes other than the example illustrated in the Figures, it may be advantageous to etch the trench at an earlier stage, for example, prior to implantation of the source and channel-accommodating regions.

In the illustrated embodiment, after the trench has been etched, a relatively thick layer 18 of silicon dioxide (typically 100 to 400 nm with a trench width of 2 microns) is grown or deposited uniformly over the semiconductor body 10. In the process as illustrated, the remainder of silicon dioxide layer 16 is removed prior to deposition of layer 18, but this may not be necessary where layers 16 and 18 are formed of the same material as they will then both be removed in a subsequent processing step. A layer of polycrystalline silicon 22 (hereinafter referred to as "poly-Si") is contour deposited over layer 18.

Figure 4:
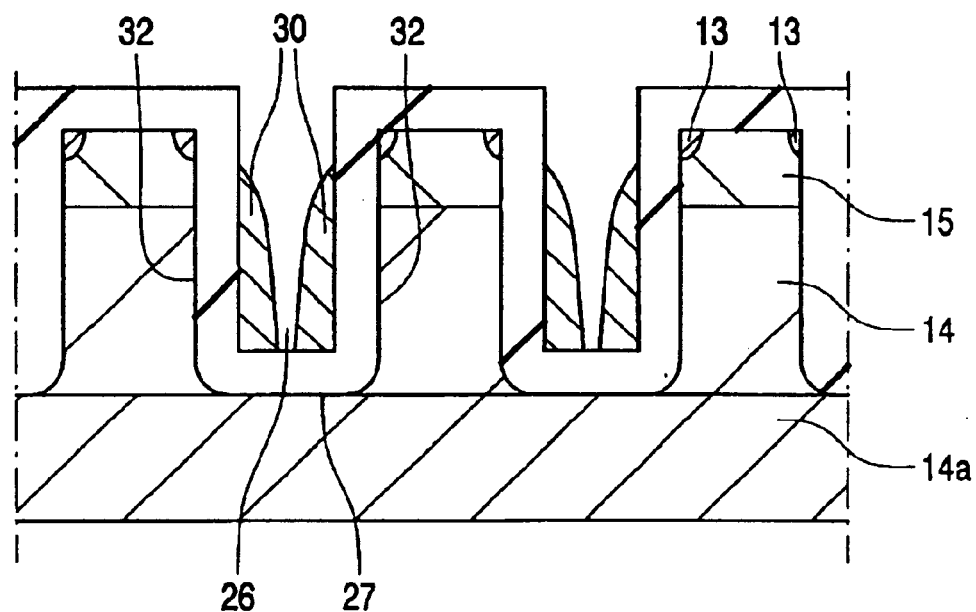
Figure 5:
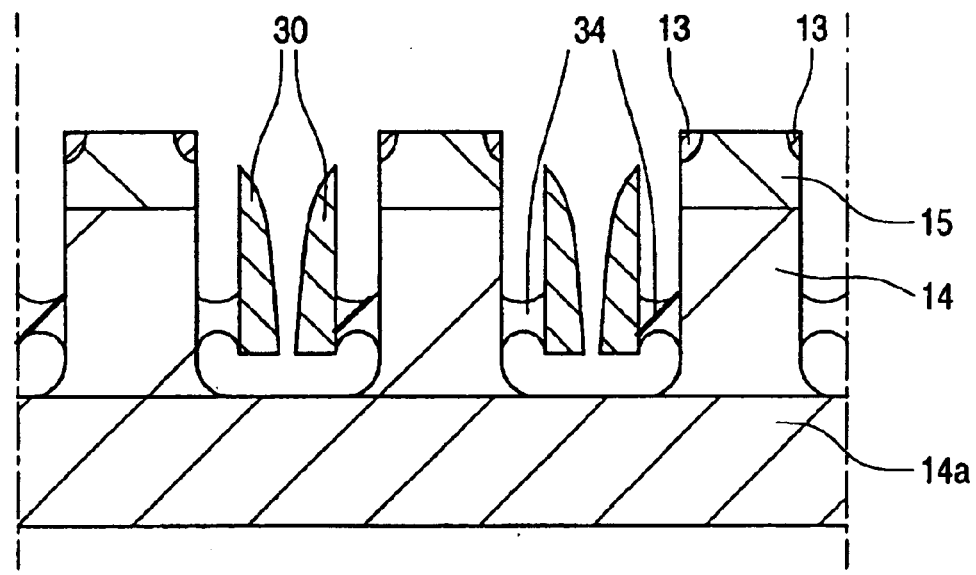

Poly-Si layer 22 is etched back anisotropically to form a pair of spacers 30, each extending over and along a respective one of the opposing side-walls 32 of the trench 20. A path 26 is defined by the spacers, which extends therebetween to the underlying silicon dioxide layer 18, as shown in FIG. 4.

Material is then etched away isotropically from the silicon dioxide layer 18 using a wet chemical etch for example. Owing to the presence of the path 26, the etchant has direct access to the silicon dioxide material overlying the trench bottom 27. The etchant thus removes silicon dioxide material between the spacers 30 and the adjacent semiconductor body regions at both the upper and lower ends of the spacers simultaneously. This etching process is ceased before the silicon dioxide material of layer 18 is entirely removed, such that the spacers 30 are attached to the respective side-walls 32 of the trench 20 by and supported by bridges 34 of silicon dioxide material (see FIG. 5).

Figure 6:
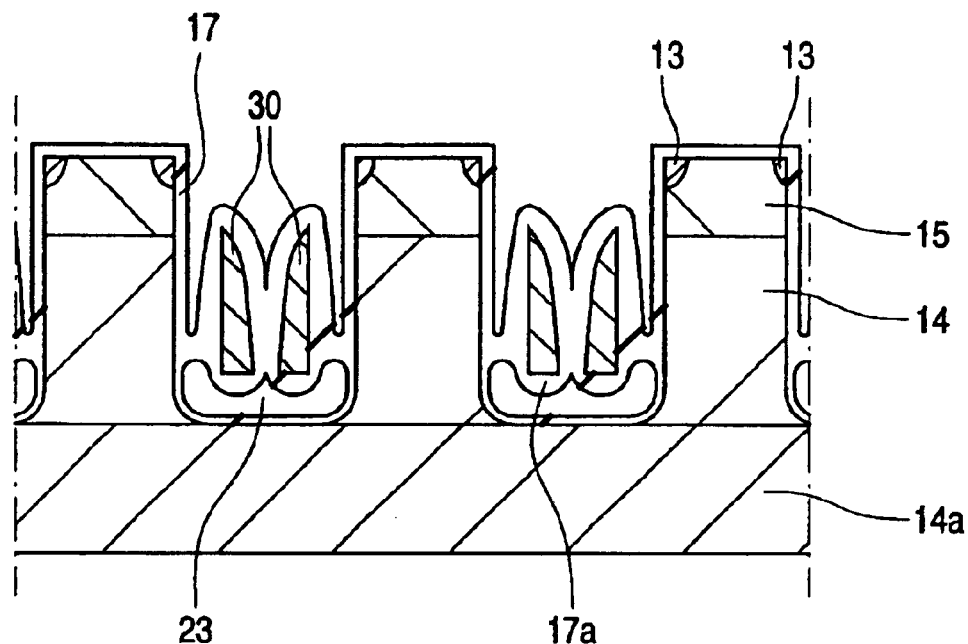

An oxidation step is then carried out. The resulting growth of silicon dioxide from the exposed surfaces of the poly-Si spacers 30 closes the path 26 to form a cavity 23 adjacent the bottom 27 of the trench 20. A silicon dioxide layer 17 is also formed over the upper major surface 10a of the semiconductor body 10, the exposed portions of the trench side-walls 32, and the trench bottom 27, as shown in FIG. 6.

Instead of oxidising the poly-Si spacers, the path 26 may alternatively be closed by uniformly depositing a layer of material, such as silicon dioxide or silicon nitride for example.

The remainder of the trench is then filled with poly-Si to form the gate 11, as shown in FIG. 7. The silicon dioxide overlying the upper ends of the spacers 30 may be removed by an anisotropic etch prior to filling the trench so that the spacers are electrically connected to the bulk of the poly-Si to increase the depth of the electrode. It may be advantageous to form additional spacers (not shown) between spacers 30 and the trench side-walls 32 before the anisotropic etch to protect the bridges 34 during that etch.

It will be evident that many variations and modifications are possible within the scope of the invention. For example, in the process described with reference to FIGS. 2 to 7, material of the same composition as the gate insulating layer 17 is etched away below the eventual location of the gate electrode to provide a space which is enclosed to form the cavity 23. An alternative approach is shown in FIG. 8, in which a material of different composition to the gate insulating layer acts as a filler material and is etched away.

Figure 8:
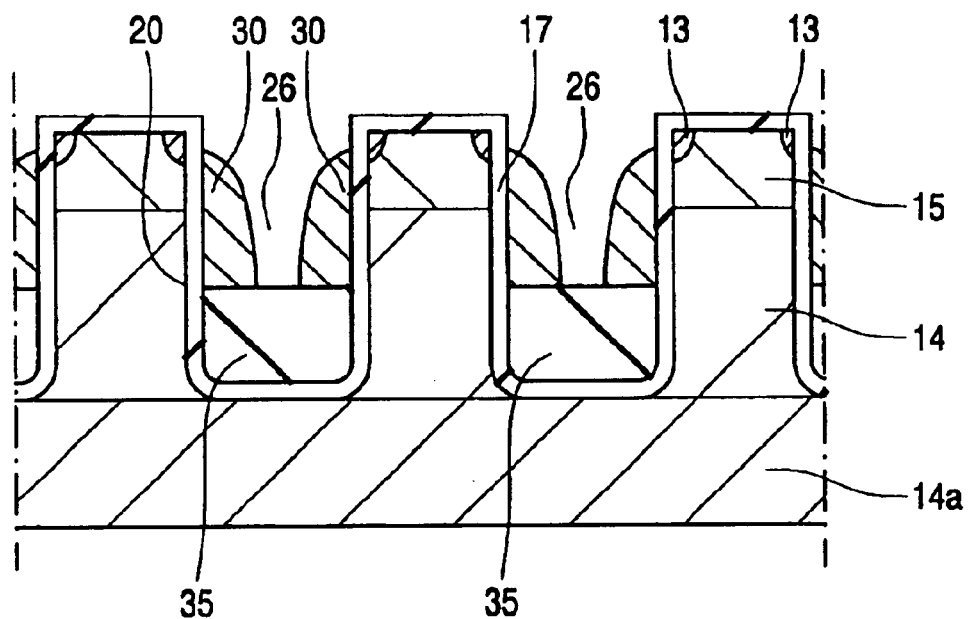
FIG. 8 is a cross-sectional view of transistor cell areas of a semiconductor body at an intermediate stage in the manufacture of a trench-gate power transistor by another example of a method in accordance with the present invention.

To achieve the configuration illustrated in FIG. 8, the same process as described above may be followed up to the step in which a trench 20 is etched into the semiconductor body. A thin gate insulating layer 17 is then uniformly deposited over the upper surface of the body and the trench is partially filled with the filler material 35. The filler material should be selectively etchable with respect to the gate insulating layer and the gate electrode material. Silicon nitride would be suitable for example where the gate insulating layer is formed of silicon dioxide and the gate electrode material is poly-Si. Spacers 30 of gate electrode material are then defined as described above to define a path 26 via which the filler material is etched away to form a space below the gate electrode material. The subsequent processing steps may correspond to those described in relation to FIGS. 6 and 7 above. Although an additional deposition step is required to provide the selectively etchable filler material 35, it provides a more clearly defined end point for the etching process, relative to the end point shown in FIG. 5 which may need closer control to obtain the desired width for the bridges 34.

Figure 9:
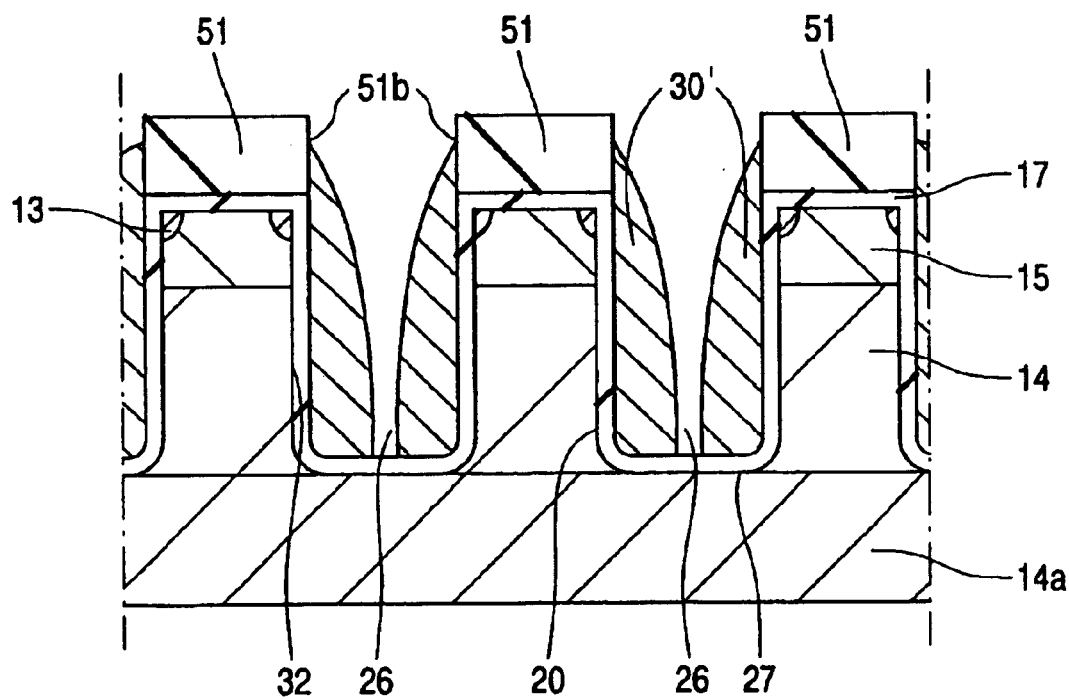
FIGS. 9 and 10 are cross-sectional views of device cell areas of a semiconductor body at intermediate stages in the manufacture of a trenched semiconductor device by a further example of a method in accordance with the present invention.

A further variation of the process of FIGS. 2 to 7 will now be described with reference to FIGS. 9 and 10. The initial process steps arriving at the stage shown in FIG. 9 are similar to those depicted in FIGS. 2 to 4, except that a relatively thin gate insulating layer 17 (typically around 40 nm thick) is grown or deposited instead of thick layer 18.

Also, the trench etch mask 51 is retained during formation of the spacers 30', and the etch used to form the spacers is appropriately controlled, so that the spacers extend vertically beyond the interface between the mask 51 and the layer 17, along the masking edges 51b. As before, the spacers 30' define a path 26 via which gate insulating material can be etched away from between the gate electrode material and the bottom 27 of the trench 20. In applications where the trench electrode 11 extends deep into the drift region 14 (that is, in a deep trench 20) to provide a field plate below the gate portion, the etching process may advantageously be continued to remove gate insulating material from between the gate electrode material and the side-walls 32 of the trench 20, so that the cavity 23 extends along the sides of a lower portion of the trench electrode 11. The material is preferably etched away vertically as far as the lower boundary of the channel accommodating region 15 (as shown in FIG. 10), but no further to avoid degrading the modulation of the channel by the gate electrode. An etch stop layer (not shown, and formed of silicon nitride for example, when the gate electrode material is silicon dioxide) may be included in the gate electrode material to provide a well defined end point for this etching process.

In a similar manner to the process of FIGS. 2 to 7, the path 26 can then be filled by oxidising the spacers 30' to form an oxide "plug" 37. The gate electrode is completed by filling the trench with further gate electrode material, after removing oxide from the top of the spacers 30', as shown in FIG. 10.

In a variation of the processes described above, the path defined between the spacers 30, 30' may be closed with trench electrode material during the process of completing the trench electrode. With this approach, the step of growing a layer over the spacers (by oxidation or deposition) may be omitted. However, it will generally be desirable to provide a passivation layer over the trench bottom and side-walls to passivate the silicon surface states of the drift region 14 in the current path of the device. Also, inclusion of an insulating layer over the bottom of the gate electrode helps to ensure that gate-drain shorts do not occur.

The particular examples described above are n-channel devices, in which the regions 13, 14 and 14a are of n-type conductivity, the region 15 is of p-type, and an electron inversion channel 12 is induced in the region 15 by the gate 11. By using opposite conductivity type dopants, a p-channel device can be manufactured by a method in accordance with the invention. In this case, the regions 13, 14 and 14a are of p-type conductivity, the region 15 is of n-type, and a hole inversion channel 12 is induced in the region 15 by the gate 11.

Figure 10:
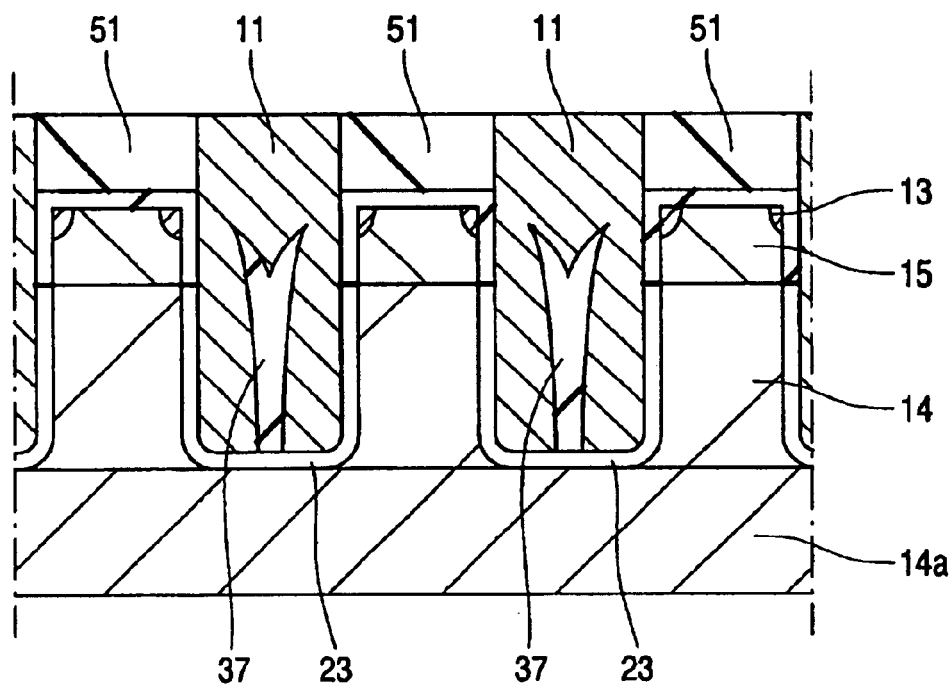
Figure 11:
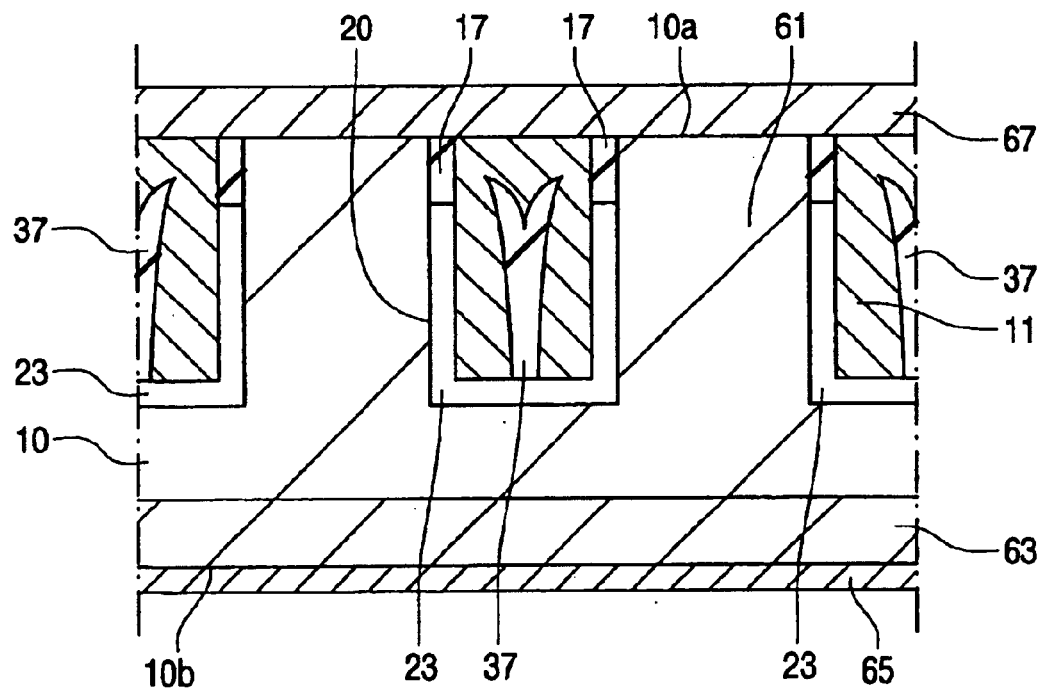
FIG. 11 is a cross-sectional view of device cell areas of the semiconductor body of a Schottky rectifier according to a further embodiment of the invention.

It will be appreciated that the modified process described in relation to FIGS. 9 and 10 may be applied to Schottky rectifier configurations having a trenched electrode. Known rectifiers of this nature are described in U.S. Pat. No. 5,612,567, referred to above. The device cell area of an embodiment of a rectifier according to the present invention is illustrated in FIG. 11. In this structure, trench electrode 11 of poly-Si extends into a trench 20 formed in the drift region 61 of the semiconductor body 10 of the device. The drift region overlies a more highly doped cathode region 63. A cathode electrode 65 is provided in contact with the cathode region at the bottom major surface 10b of the semiconductor body. Anode electrode 67 comprises a metal and/or metal silicide that forms a Schottky barrier with the drift region 61 and contacts this region at the front major surface 10a. The anode electrode 67 is electrically connected to the trench electrode 11. A thin layer of gate insulator 17 is present adjacent the top of the gate electrode. It may be preferable to minimise the vertical extent of this layer. For example, the uppermost portion of the layer may be etched away prior to formation of the anode electrode 67. A cavity 23 is defined between (i) the bottom and at least the lower portion of the trench electrode 11 and (ii) the adjacent portion of the drift region 61.

In accordance with the invention, the thick layer of oxide typically provided around a field plate of a trench-gate field effect transistor or a trenched electrode of a Schottky rectifier can be replaced with a relatively narrow cavity having similar dielectric coupling properties, but a much lower dielectric constant. This enables narrower trenches to be formed, leading to a higher cell density in the device and hence a lower specific on-resistance. The Schottky rectifier of FIG. 11 is typically a discrete rectifier device. However, a Schottky rectifier in accordance with the invention may be integrated in the same device body as a MOSFET in accordance with the invention, with region 61 as part of region 14, and region 63 as part of region 14a, and electrode 67 as part of the source electrode.

Figure 12:
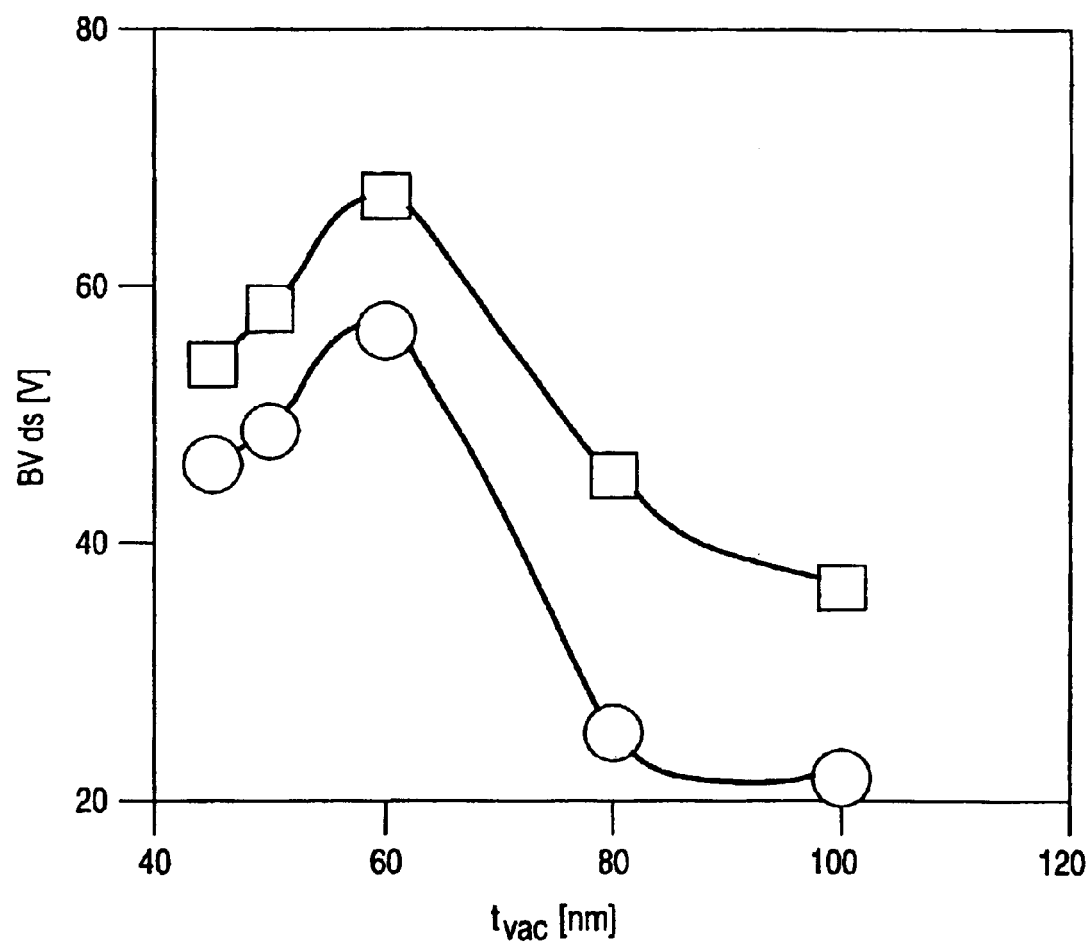
FIG. 12 is a graph showing the relationship between breakdown voltage and cavity thickness.

FIG. 12 is a graph showing the relationship between the simulated drain-source breakdown voltage ($BV_{ds}$) as a function of the cavity thickness ($t_{vac}$) for a cavity enclosing an ideal vacuum. Plots are shown for two different doping profiles for the drift region adjacent to the trench electrode. The square symbols correspond to a linearly graded doping profile, whilst the circular symbols relate to a uniform profile. As described in U.S. Pat. Nos. 5,612,567 and 5,637,898 referred to above, a linearly graded doping profile may increase the voltage blocking capability of a device including a trenched electrode. It can be seen that a cavity of thickness 50 nm provides a breakdown voltage of around 50V with the uniform profile and around 60V with the linear profile. This is approximately equivalent to a silicon dioxide layer 200 nm thick. Thus, replacing such an oxide layer around a trenched field plate with a cavity with equivalent breakdown properties would enable the width of the trench to be reduced by around 0.3 micron.

In a further variation of the methods described above, the cavity 23 may be defined by the deposition of the trench electrode material, by appropriate control of the deposition conditions, such that one or more cavities are formed between the trench electrode 11 and the bottom 27 of the trench 20. For example, in a relatively narrow and deep trench, the trench electrode material may be non-uniformly deposited in the lower part of the trench, resulting in one or more cavities.

In the embodiment described above where a path between spacers of trench electrode material is closed by oxidation of the spacers, it will be appreciated that this process will result in the cavity containing the gas used for oxidation (oxygen or water vapour, for example). Accordingly, the oxidising gas used may be selected for its dielectric properties. Similarly, in other processes utilised to form a cavity, the atmosphere present when the cavity is formed may be selected having regard to the desired properties of the cavity contents.

Semiconductor materials other than silicon may be used for devices in accordance with the invention, for example silicon carbide.

It will be appreciated that this invention is applicable to a range of devices which include an insulated trench electrode in a trench in addition to those specifically referred to above, such as bipolar transistors, VDMOS and lateral trench-gate MOSFETs.

From reading the present disclosure, other variations and modifications will be apparent to persons skilled in the art.

Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to such features and/or combinations of such features during the prosecution of the present Application or of any further Application derived therefrom.

We claim:

1. A semiconductor device including an insulated trench electrode in a trench, the trench extending in a semiconductor body portion of the device, wherein the trench electrode is dielectrically coupled to the body portion by an insulating layer at a side-wall of the trench, and there is a cavity located adjacent only a lower portion of the trench electrode and having a gaseous content between the bottom of the trench electrode and the bottom of the trench to provide a structure for reducing the dielectric coupling between the trench electrode and the body portion at the bottom of the trench.

2. A device of claim 1 wherein a passivation layer over at least one of the trench wall and the bottom of the trench electrode forms at least part of the wall of the cavity.

3. A device of claim 1 wherein the cavity extends along the sides of a lower portion of the trench electrode.

4. A device of claim 1 including a source region and a drain region of a first conductivity type, having therebetween a channel-accommodating region of an opposite, second conductivity type, wherein the trench electrode forms a gate and extends from the source region, through the channel-accommodating region to the drain region.

5. A device of claim 4 wherein the drain region comprises a drain drift region and a drain contact region, with the drain drift region between the channel-accommodating region and the drain contact region, and the drain drift region is doped to a lesser degree than the drain contact region, at least a portion of the cavity being between the trench electrode and the drain contact region.

6. A device of claim 5 wherein the cavity extends substantially from the trench electrode across the drain drift region towards the drain contact region.

7. A device of claim 1 wherein the body portion is a drift region contacted by a Schottky electrode which forms a Schottky barrier with the drift region.

* * * * *